(12) United States Patent
Lin

(10) Patent No.: US 7,462,026 B2
(45) Date of Patent: Dec. 9, 2008

(54) MOLD CORE HAVING A TEMPERATURE CONTROL APPARATUS

(75) Inventor: Jhy-Chain Lin, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 157 days.

(21) Appl. No.: 11/433,244

(22) Filed: May 12, 2006

(65) Prior Publication Data

US 2006/0278264 A1 Dec. 14, 2006

(30) Foreign Application Priority Data

Jun. 10, 2005 (CN) .......................... 2005 1 0035286

(51) Int. Cl.
*B29C 45/72* (2006.01)
(52) U.S. Cl. ........................ 425/144; 425/548; 425/552
(58) Field of Classification Search ................. 425/143, 425/144, 547, 548, 552; 264/327, 40.6
See application file for complete search history.

(56) References Cited

U.S. PATENT DOCUMENTS 3,583,467 A * 6/1971 Bennett et al. .............. 164/458
4,523,084 A * 6/1985 Tamura et al. .............. 219/497
5,423,670 A * 6/1995 Hamel ........................ 425/144
7,169,346 B2 * 1/2007 Johns et al. ................. 264/320

FOREIGN PATENT DOCUMENTS

JP          1-103419       *   4/1989

* cited by examiner

*Primary Examiner*—Tim Heitbrink
(74) *Attorney, Agent, or Firm*—Steven M. Reiss

(57) ABSTRACT

An temperature control apparatus includes a temperature detecting element (50), a control circuit (60), and a thermoelectric unit (70). The temperature detecting element contacts to a first surface (82) of a predetermined target (800). The control circuit is electrically connected to the temperature detecting element. The thermoelectric unit is electrically connected to the control circuit, and contacts a second surface of the predetermined target. The temperature detecting element detects a temperature signal. The temperature signal is input into the control circuit. The control circuit changes the temperature signal into an electrical current signal, and the electrical current signal drives the thermoelectric unit to control the temperature of the predetermined target.

17 Claims, 2 Drawing Sheets

MOLD CORE HAVING A TEMPERATURE CONTROL APPARATUS

TECHNICAL FIELD

The present invention generally relates to apparatuses for temperature control, more particularly, to an electric apparatus for controlling the temperature in micro-lens arrays.

BACKGROUND

Usually, micro-lens arrays are used in net-like distributed light guide plates for equably guiding light. The micro-lens array has a plurality of hemispherical lenses. The micro-lens array is ususally made of a transparent material such as polycarbonate or polymethyl methacrylate (PMMA) by heat press molding. Before molding the micro-lens array, a mold core having a plurality of tiny grooves is made using electroforming micro molding lithography. A transparent base is then pressed by the mold core under high temperature and high pressure in a manner so as to create a net-like micro-lens array. The hemispherical lenses are formed by the cohesion and surface tension of the base material under high temperature and high pressure. Thus, the hemispherical lenses may not have the same shape as the tiny grooves of the mold core. Therefore, the micro-lens array thus manufactured may be imprecisely molded.

FIG. 1 shows a typical process for making the micro-lens array. A base 10 is softened under a temperature higher than its glass transition temperature. The base 10 is then pressed under high temperature and high pressure by a mold core 20 which has a plurality of tiny grooves 22 thereon. The base 10 is distorted to fill the tiny grooves 22 under the pressure of the mold core 20, thus forming a plurality of hemispherical micro-lenses 12. During the process of making the micro-lens array, it is very important to control the temperature of heat pressing mold.

A typical method for controlling temperature is to use a water circulation cooling system. However, the water circulation cooling system is slow to reach a predetermined temperature when the molding temperature changes. Furthermore, the water circulation cooling system can take up a lot of space.

Therefore, it is desirable to obtain a temperature control apparatus which can overcome the above-described problems.

SUMMARY OF THE INVENTION

In one embodiment thereof, a temperature control apparatus includes a temperature detecting element, a control circuit, and a thermoelectric unit. The temperature detecting element contacts a first surface of a predetermined target. The control circuit is electrically connected to the temperature detecting element. The thermoelectric unit is electrically connected to the control circuit, and contacts a second surface of the predetermined target. The temperature detecting element detects a temperature signal. The temperature signal is input into the control circuit. The control circuit changes the temperature signal to an electrical current signal, and the electrical current signal drives the thermoelectric unit to control the temperature of the predetermined target.

Other advantages and novel features will become more apparent from the following detailed description when taken in conjunction with the accompanying drawings.

BRIEF DESCRIPTION OF THE DRAWINGS

Many aspects of the temperature control apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE EMBODIMENT

Figure 1:
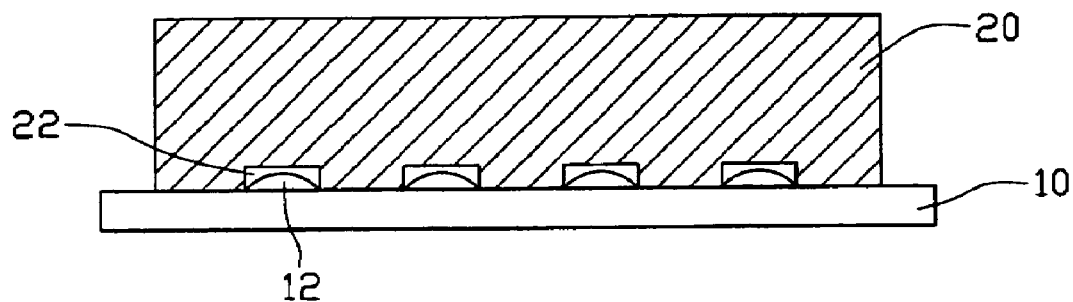
FIG. 1 is a schematic view of a typical mold core for pressing molding micro-lens arrays.
Figure 2:
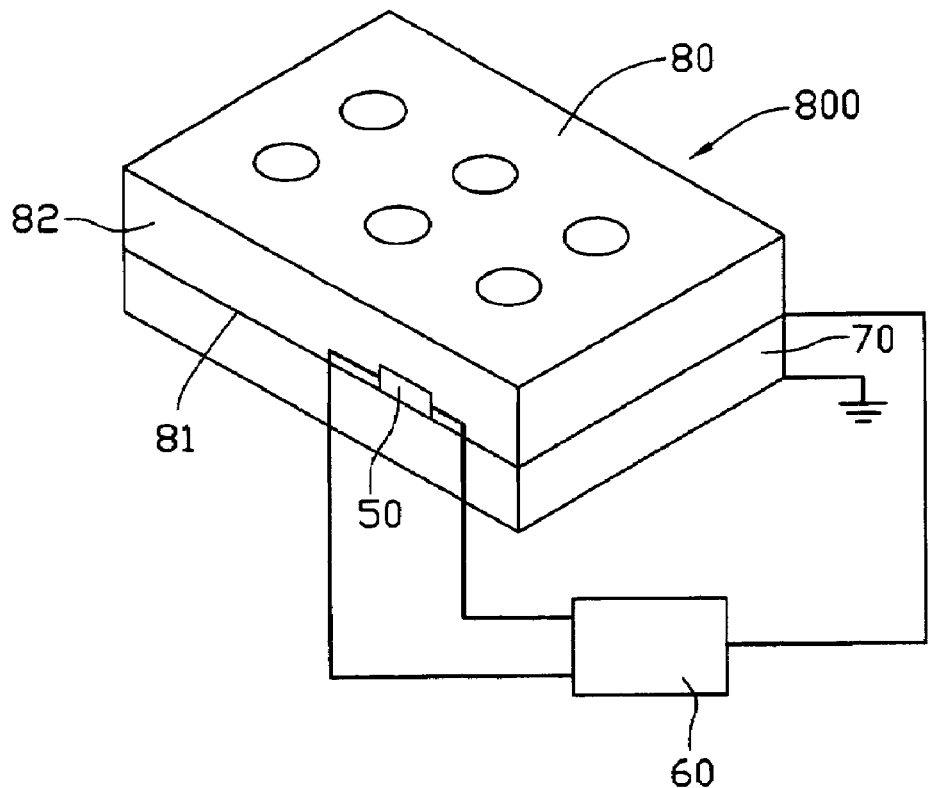
FIG. 2 is a schematic view of an temperature control apparatus in accordance with a preferred embodiment.

Referring to FIG. 2, in a preferred embodiment, a temperature controlling apparatus is used to control temperature of a predetermined target such as a mold core 800 during a press molding process. In this embodiment, the mold core 800 has a cuboid shape, including a forming surface 80, an opposite non-forming surface 81, and four side surfaces 82. It is to be understood that the mold core 800 can also have a different shape, and have different surfaces.

The temperature control apparatus includes a temperature detecting element 50 such as a thermistor, a control circuit 60, and a thermoelectric unit 70. The temperature detecting element 50 is attached to the side surface 82 of the mold core 800 for detecting the temperature of the mold core 800. The control circuit 60 is electrically connected to the temperature detecting element 50, and the thermoelectric unit 70 is electrically connected to the control circuit 50. The thermoelectric unit 70 contacts the non-forming surface 81 of the mold core 800. It is to be understood that the temperature detecting element 50 and the thermoelectric unit 70 can also contact any other surfaces of the mold core 800 as long as the press molding process is not effected.

Figure 3:
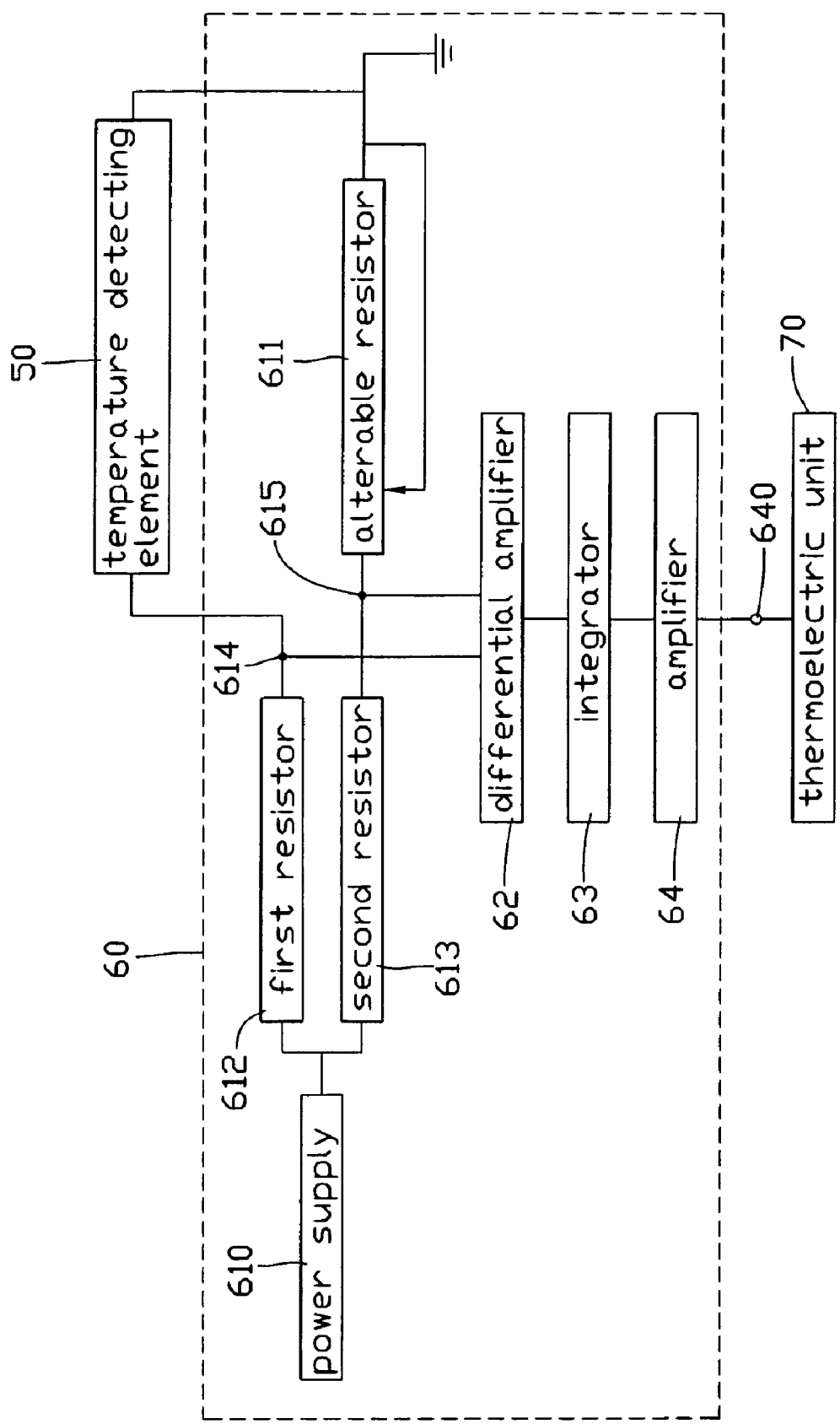
FIG. 3 is a schematic view of the temperature detecting element, the control circuit, and the thermoelectric unit 70 in FIG. 2.

Referring to FIG. 3, the control circuit 60 includes a comparison circuit (not labelled) electrically connected to the temperature detecting element 50, a differential amplifier 62 electrically connected to the comparison circuit, an integrator 63 electrically connected to the differential amplifier 62, and an amplifier 64. The amplifier 64 has a connecting port 640 electrically connected to the thermoelectric unit 70.

The comparison circuit is a Wien-Bridge circuit, including a power supply 610, an alterable resistor 611, a first resistor 612, and a second resistor 613. The temperature detecting element 50 is serially connected with the first resistor 612, and the alterable resistor 611 is serially connected with the second resistor 613. The serial circuits of the temperature detecting element 50 with the first resistor 612 and the alterable resistor 611 with the second resistor 613 are connected in parallel to the power supply 610.

A first port 614 is located between the temperature detecting element 50 and the first resistor 612, and a second port 615 is located between the alterable resistor 611 and the second resistor 613. The first port 614 and the second port 615 are both connected to the differential amplifier 62 for outputting signals.

Peltier effect will occur when a direct current is introduced in the thermoelectric unit 70. The thermoelectric unit 70 has a heating portion and a cooling portion. In this embodiment, the heating portion contacts the non-forming surface 81 of the mold core 800.

When using the apparatus for controlling temperature during a press molding process, the temperature detecting element 50 detects a temperature signal from the mold core 800. The temperature detecting element 50 then changes the temperature signal to a resistance value. The alterable resistor 611 has a predetermined resistance value in accordance with a predetermined temperature. If the two resistance values are different, a voltage differential signal will be input into the differential amplifier 62 from the two ports 614, 615. The differential amplifier 62 analyses the voltage differential signal, and outputs an analytical signal to the integrator 63. The integrator 63 integrates the analytical signal, and gets a temperature compensation signal. The temperature compensation signal is amplified by the amplifier 64, and is changed to an electrical current signal. The electrical current signal is input into the thermoelectric unit 70 to drive the thermoelectric unit 70 to heat or cool the mold core 800.

When the temperature of the mold core 800 is lower than the predetermined temperature, the electrical current signal is gradually increased until the temperature of the mold core 800 is equal to the predetermined temperature. When the temperature of the mold core 800 is higher than the predetermined temperature, the electrical current signal is gradually weakened until the temperature of the mold core 800 is equal to the predetermined temperature. The predetermined temperature can be changed by adjusting the resistance value of the alterable resistor 611.

Thus the temperature control apparatus can control the temperature of the mold core 800 during a press molding process in a timely fashion by using the control circuit 60 and the thermoelectric unit 70. Furthermore, the apparatus has a simple configuration, and occupies a small space.

It is believed that the present embodiments and their advantages will be understood from the foregoing description, and it will be apparent that various changes may be made thereto without departing from the spirit and scope of the invention or sacrificing all of its material advantages, the examples here before described merely being preferred or exemplary embodiments of the invention.

What is claimed is:

1. A mold core having a temperature control apparatus, said mold core comprising:
   a temperature detecting element contacting a first surface of a predetermined target;
   a control circuit electrically connected to the temperature detecting element; and
   a thermoelectric unit electrically connected to the control circuit, the thermoelectric unit including a heating portion and a cooling portion, at least one of the heating portion and the cooling portion of the thermoelectric unit contacting a second surface of the predetermined target;
   wherein the temperature detecting element detects a temperature signal, the temperature signal is input into the control circuit, the control circuit changes the temperature signal to an electrical current signal, and the electrical current signal drives the thermoelectric unit to control the temperature of the predetermined target.

2. The mold core as claimed in claim 1, wherein the predetermined target is a mold core of a press molding system, the first surface is a forming surface, and the second surface is a non-forming surface.

3. The mold core as claimed in claim 1, wherein the temperature detecting element is a thermistor.

4. The mold core as claimed in claim 3, wherein the control circuit includes a comparison circuit electrically connected to the temperature detecting element, a differential amplifier electrically connected to the comparison circuit, an integrator electrically connected to the differential amplifier, and an amplifier electrically connected to the thermoelectric unit.

5. The mold care as claimed in claim 4, wherein the comparison circuit includes a power supply, an alterable resistor, a first resistor and a second resistor, the temperature detecting element is serially connected with the first resistor, the alterable resistor is serially connected with the second resistor, the serial circuits of the temperature detecting element with the first resistor, and the alterable resistor with the second resistor are connected in parallel to the power supply.

6. The mold core as claimed in claim 5, wherein the temperature detecting element is serially connected with the first resistor, and the alterable resistor is serially connected with the second resistor.

7. The mold core as claimed in claim 6, wherein the serial circuits of the temperature detecting element with the first resistor and the alterable resistor with the second resistor are connected in parallel to the power supply.

8. A mold core having a temperature control apparatus the apparatus comprising:
   a temperature detecting element attached to a first surface of the mold core, configured for detecting a temperature signal of the mold core;
   a thermoelectric unit including a heating portion and a cooling portion, at least one of the heating portion and the cooling portion thermally contacting a second surface of the mold core; and
   a control circuit electrically connected to the temperature detecting element and the thermoelectric unit, the control circuit being configured for converting the temperature signal into an electric signal to drive the thermoelectric unit to heat or cool the mold core.

9. The mold core as claimed in claim 8, wherein the temperature detecting element is a thermistor.

10. The mold core as claimed in claim 8, wherein the control circuit includes a comparison circuit electrically connected to the temperature detecting element, a differential amplifier electrically connected to the comparison circuit, an integrator electrically connected to the differential amplifier, and an amplifier electrically connected to the thermoelectric unit.

11. The mold core as claimed in claim 10, wherein the comparison circuit includes a power supply, an alterable resistor, a first resistor and a second resistor, the temperature detecting element is serially connected with the first resistor, the alterable resistor is serially connected with the second resistor, the serial circuits of the temperature detecting element with the first resistor, and the alterable resistor with the second resistor are connected in parallel to the power supply.

12. The mold core as claimed in claim 11, wherein the temperature detecting element is serially connected with the first resistor, and the alterable resistor is serially connected with the second resistor.

13. The mold core as claimed in claim 12, wherein the serial circuits of the temperature detecting element with the first resistor and the alterable resistor with the second resistor are connected in parallel to the power supply.

14. A mold core having a temperature control apparatus, said apparatus comprising:
   a temperature detecting element attached to the mold, the temperature detecting element being configured for detecting a temperature signal of the mold;

a thermoelectric unit including a heating portion and a cooling portion, at least one of the heating portion and the cooling portion thermally contacting a non-forming surface of the mold; and a control circuit electrically connected to the temperature detecting element and the thermoelectric unit, the control circuit being configured for converting the temperature signal into an electric signal to drive the thermoelectric unit to heat or cool the mold so as to regulate the temperature of the mold to a predetermined value.

15. The mold core as claimed in claim 14, wherein the control circuit includes a comparison circuit electrically connected to the temperature detecting element, a differential amplifier electrically connected to the comparison circuit, an integrator electrically connected to the differential amplifier, and an amplifier electrically connected to the thermoelectric unit.

16. The mold core as claimed in claim 15, wherein the comparison circuit includes a power supply, an alterable resistor, a first resistor and a second resistor, the temperature detecting element is serially connected with the first resistor, the alterable resistor is serially connected with the second resistor, the serial circuits of the temperature detecting element with the first resistor, and the alterable resistor with the second resistor are connected in parallel to the power supply.

17. The mold core as claimed in claim 16, wherein the predetermined value is achieved by adjust the alterable resistor.

* * * * *